United States Patent [19]

Fountain et al.

[11] Patent Number: 4,812,923
[45] Date of Patent: * Mar. 14, 1989

[54] TAPE INSPECTION APPARATUS

[75] Inventors: Frank S. Fountain, Wilmington, Del.; Donald K. Pusey, West Grove, Pa.; Keith A. McCloy, Chillicothe, Ohio

[73] Assignee: E. I. Du Pont de Nemours and Company, Wilmington, Del.

[*] Notice: The portion of the term of this patent subsequent to Aug. 11, 2004 has been disclaimed.

[21] Appl. No.: 58,210

[22] Filed: Jun. 4, 1987

Related U.S. Application Data

[63] Continuation-in-part of Ser. No. 759,846, Jul. 29, 1985, Pat. No. 4,686,563, which is a continuation-in-part of Ser. No. 673,767, Nov. 21, 1984, abandoned.

[51] Int. Cl.$^4$ .................. G11B 27/36; H04N 5/782
[52] U.S. Cl. .................... 360/25; 358/336; 324/212; 360/38.1; 369/53; 369/58
[58] Field of Search .............. 358/314, 336; 360/31, 360/38.1, 25, 26; 369/53, 58; 324/212

[56] References Cited

U.S. PATENT DOCUMENTS

| | | | |
|---|---|---|---|
| 3,474,331 | 10/1969 | Chur | 360/25 X |
| 3,525,930 | 8/1970 | Hodge | 360/31 |
| 3,562,635 | 2/1971 | Parker | 360/25 X |
| 3,662,158 | 5/1972 | Wong et al. | 235/92 |
| 3,755,731 | 8/1973 | Young | 360/26 X |
| 4,255,807 | 3/1981 | Cosby | 360/25 X |
| 4,325,134 | 4/1982 | Langby | 369/53 |
| 4,404,603 | 9/1983 | Warren et al. | 324/212 X |
| 4,409,627 | 10/1983 | Eto | 360/38.1 |
| 4,417,149 | 11/1983 | Takeuchi | 250/572 |
| 4,477,890 | 10/1984 | Mooney | 369/53 |
| 4,686,563 | 8/1987 | Fountain et al. | 369/58 X |

FOREIGN PATENT DOCUMENTS

| | | | |
|---|---|---|---|
| 0183481 | 6/1986 | European Pat. Off. | |
| 48009 | 9/1980 | Japan | 369/58 |
| 113137 | 9/1980 | Japan | 369/58 |
| 171011 | 6/1982 | Japan | 360/31 |

OTHER PUBLICATIONS

"Roughness & Recording Properties of Particulate Tapes", pp. 1383–1385, IEEE, Transactions on Magnetics, Sep. 1985.

"Review of Surface Texture . . .", by Green, pp. 330–343, Properties & Metrology of Surfaces, Apr. 1968.

"Review of Methods of Measurement . . .", by Richards, pp. 453–465, Properties & Metrology of Surfaces, Apr. 1968.

Primary Examiner—Robert L. Richardson

[57] ABSTRACT

An apparatus and method for locating dropouts. Information as to dropouts in a length of tape is stored in memory and then used to compute data as to location of the dropouts. The data is used to position a tape-inspecting instrument such as a microscope over successive dropouts.

9 Claims, 6 Drawing Sheets

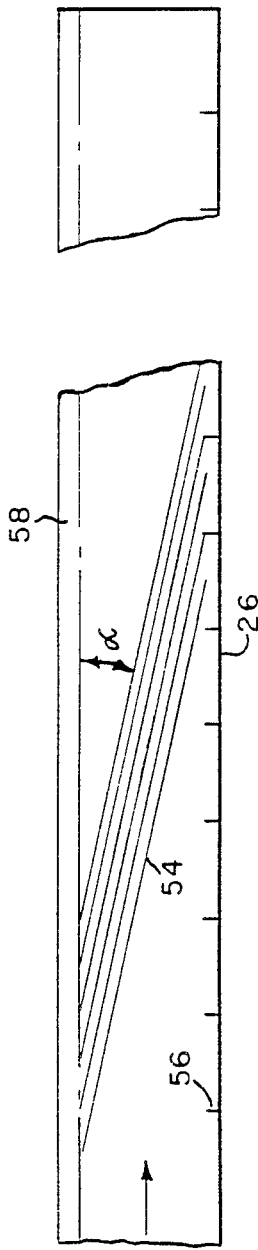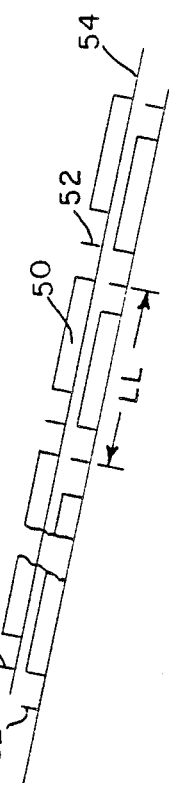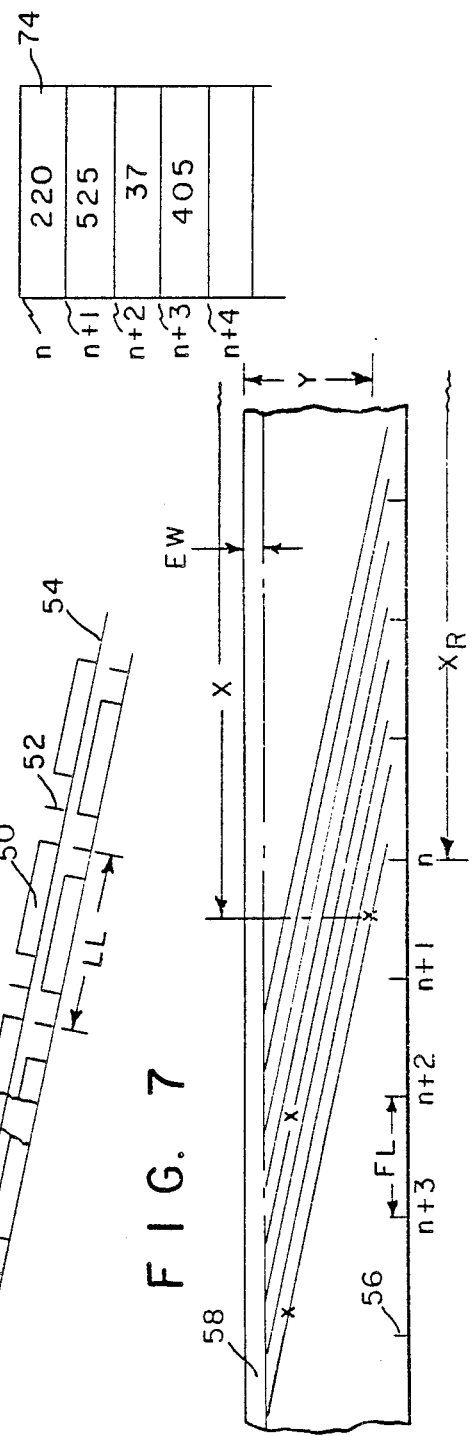

TAPE INSPECTION APPARATUS

CROSS REFERENCE

This is a continuation-in-part of our copending application Ser. No. 759,849, filed July 29, 1985 and now U.S. Pat. No. 4,686,563 which in turn is a continuation-in-part of Ser. No. 673,767, filed Nov. 21, 1984, now abandoned.

BACKGROUND

This invention relates generally to the quality of helically scanned magnetic tapes, such as video tapes or digital audio tapes and, more particularly, to the location of signal losses for purposes of analysis.

Frequently, video information is recorded on magnetic tape for replay at a later time. The quality of such a tape and the picture obtained by playing it are affected by momentary losses of the recorded signal which are usually referred to as "dropouts." One way of determining the quality of a tape has been to count the number of dropouts during one or more sampling periods as disclosed, for example, by Wong et al. in U.S. Pat. No. 3,662,158. Such information is useful in grading recorded tapes but not in efforts to identify the causes of signal losses and improve recordings by reducing the number of dropouts. Valuable information as to the reasons for losses of signal has been obtained by searching for and locating individual dropouts in the field of a microscope. First, the film must be stained with a dispersion of fine iron particles. This technique is not only laborious and time-consuming but also inconclusive since only a fraction of counted dropouts can be located for analysis.

SUMMARY

The above and other disadvantages have been overcome with an apparatus which includes a dropout detector connected to a tape player and has a positionable tape-inspecting instrument such as a microscope located adjacent the player. Guide and transport elements are provided for diverting tape from its normal path of advance into and through the focal plane of the microscope. In addition, the apparatus has a device for positioning the microscope. Interfaced with the detector, player and device, there are means for computing data as to the locations of dropouts, controlling tape advance and, with said data, positioning the microscope over the location of any detected dropout.

According to the method of the present invention, dropouts in a predetermined length of video tape are detected and information as to successive dropouts is stored in a memory array. Based on that information, data as to locations of dropouts in the predetermined length are computed. The tape is advanced through a path adjacent a positionable tape-inspecting instrument and stopped when the first dropout is located for inspection. Further advance of the tape and the position of the instrument are controlled on the basis of the computed data, thereby locating successive dropouts for inspection.

DRAWINGS

FIG. 4 is a schematic illustration of a tape recorded in the video home system (VHS) format.

FIG. 5 is a fragmentary enlargement of the diagonal stripes shown in FIG. 4.

FIG. 7 is a schematic illustration of a video tape with legends and indicia related to the manner in which dropouts are located with the apparatus shown in FIGS. 1-3.

FIG. 8 is a schematic illustration of memory locations in the apparatus of FIGS. 1 and 2.

DESCRIPTION

Figure 1:
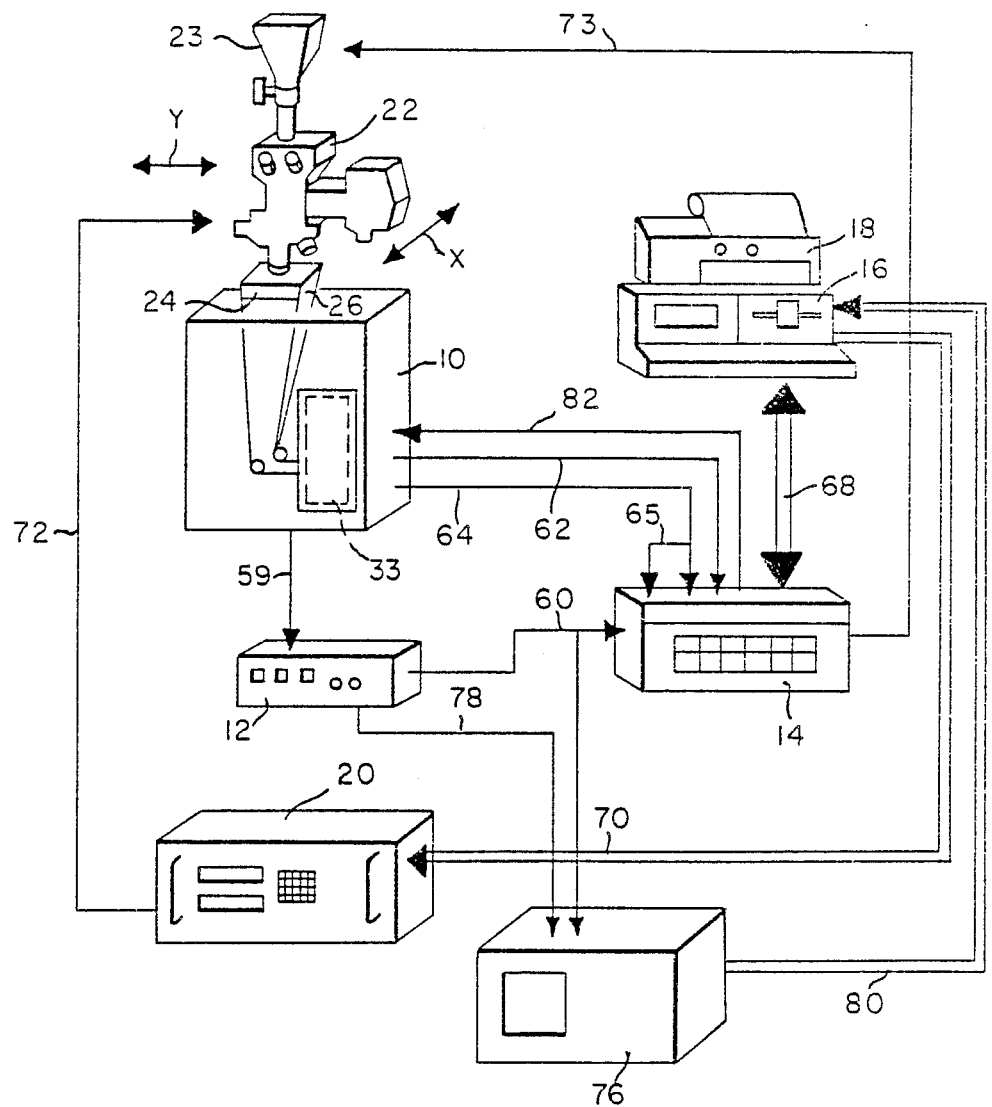
FIG. 1 is a schematic illustration of a preferred embodiment of the apparatus of the present invention.
Figure 2:
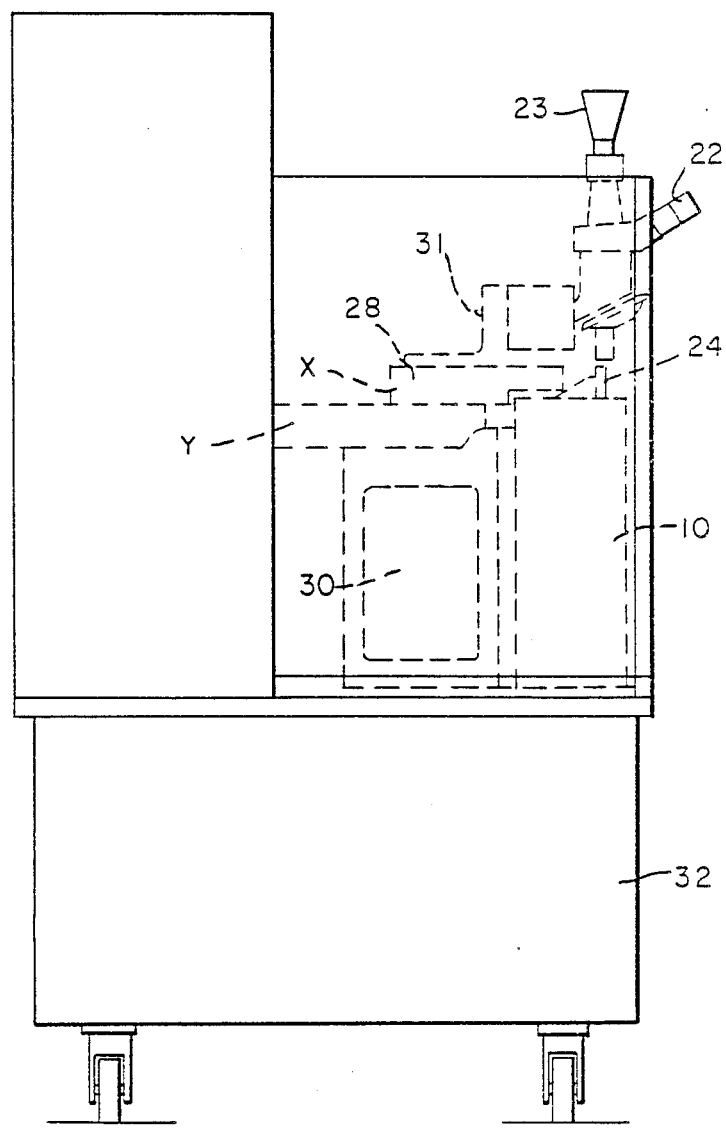
FIG. 2 is an end view of the apparatus.

In FIGS. 1 and 2, the apparatus is shown to include a video cassette recorder (VCR) 10, a dropout detector 12, a multi-programmer or interface 14, a computer 16, a printer 18 and a position controller 20 for a tape-inspecting instrument in the form of a positionable microscope 22. A camera 23 is shown with the microscope.

In an operable embodiment, VCR 10 is a Panasonic Video Cassette Recorder NV-8200 modified by provision of a shoe assembly 24 over which a loop of video tape 26 is advanced through the focal plane of microscope 22. Also, a positioning table 28 (FIG. 2) having X and Y stages is attached to a mount 30 for VCR 10. Microscope 22 is attached to the X stage of table 28 by a bracket 31. All of the equipment mentioned above is assembled and mounted on a cart 32.

In the operable embodiment of the apparatus, dropout detector 12 is a JVC Dropout Counter, Model VD-3M. Interface 14 is a Hewlett Packard (HP) Multiprogrammer, Model 6942A, and computer 16 is an HP Calculator, Model 9826. Controller 20 is a Unidex II (Aerotech, Inc.), microscope 22 is an Olympus Metallurgical Microscope, Model BHMJ, and table 28 is an Accudex 300 Series Precision Low-Speed Positioning Table (Aerotech, Inc.).

Figure 3:
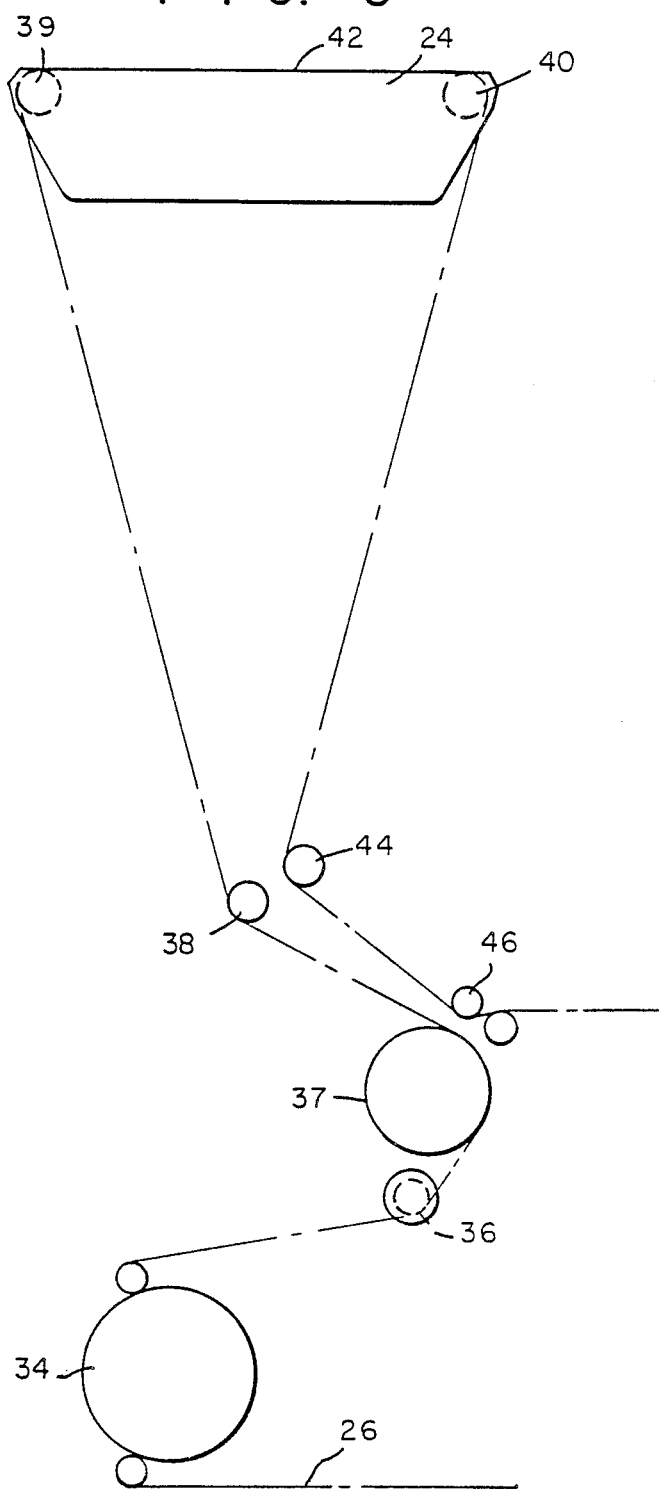
FIG. 3 is an illustration of an arrangement for diverting video tape and advancing it through the focal plane of the microscope shown in FIGS. 1 and 2.

As shown in FIG. 1 and 3, tape 26 from a cassette 33 in VCR 10 advances under a rotary head or drum 34 having a helical scanning system and over rollers 36, 37, 38 to shoe assembly 24. Assembly 24 includes rollers 39, 40 and has an upper, flat surface 42 which is located in the field of the microscope 22. From roller 40, tape 26 passes over rollers 44, 46 and is returned to the cassette. The rollers and the shoe assembly will be referred to herein as guide and transport elements for diverting tape from its normal path of advance into and through the focal plane of microscope 22.

The manner in which video information is recorded on tape 26 in the VHS format is shown schematically in FIGS. 4 and 5. There is a magnetic trace 50 for each horizontal scan line of a television (TV) display. Between successive traces 50, there are line sync pulses 52. Traces 50 and pulss 52 are recorded in diagonal stripes 54, two of which contain the information for one TV frame (1/30 sec.). The frames are identified by sync pulses 56 which are recorded at an edge of the tape. Each frame consists of 525 scan lines (traces 50) of a TV display.

Audio information is recorded on a width 58 at the other edge of tape 26.

Figure 6:
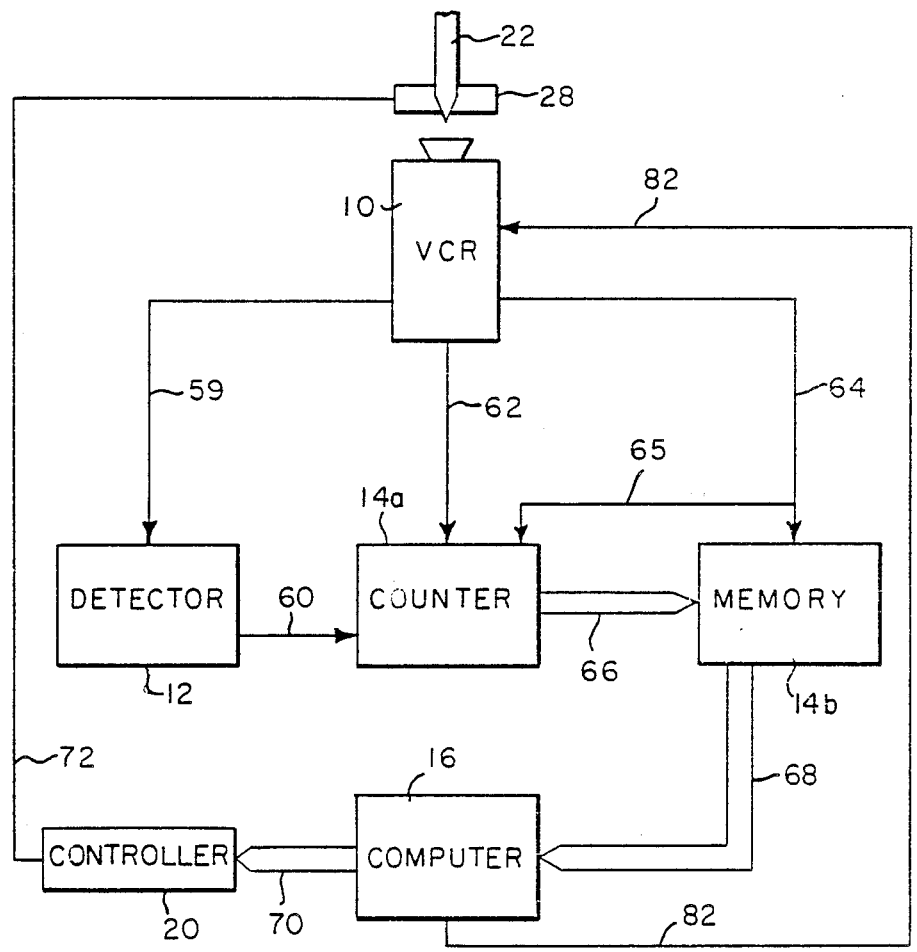
FIG. 6 is a diagram showing the flow of information in the apparatus of FIGS. 1 and 2.

With VCR 10 on "play", video signals are picked up by drum 34 (FIG. 3) and transmitted to detector 12 through a control line 59. Referring now to FIG. 6, signals indicative of a dropout pass on line 60 to a counter 14a in the interface 14. Line sync pulses 52 are transmitted from VCR 10 to counter 14a on control line 62. Frame sync pulses 56 are transmitted to a memory array 14b and to counter 14a over lines 64 and 65. As each frame sync pulse 56 is received in counter 14a, the line count of the first dropout in the previous frame is transferred to memory array 14b via bus 66. The computer is programmed to stop the tape when the first dropout in a predetermined length of tape reaches the field of microscope 22. Then, information as to that dropout, namely, the stored counts of frame sync pulss and lines, is transmitted from memory array 14b, on bus 68, to computer 16 which is programmed to convert that information into data representative of the X-Y coordinates of the location of the dropout. The data is transmitted through a bus 70 to controller 20 which, in turn, transmits control signals through a line 72 to the X and/or Y stages of positioning table 28. In this manner, the microscope 22 is positioned at the location of the dropout and it can be examined optically and/or photographed, as desired. Command signals for camera 23 are transmitted over control line 73 (FIG. 1). Simultaneously, the data for each dropout in one or more lengths can be charted by printed 18 to facilitate an analysis of the durations and profiles of dropouts.

Referring again to FIG. 1, a waveform recorder 76 (Hewlett Packard, Model 5180) can be used to correlate the located visual defect with an electronic signal. Demodulated video signal 78 from the detector 12 is the input for the recorder 76. Dropout signal 60 from the detector triggers the waveform recorder, thereby causing each dropout waveform to e stored. Computer 16 commands the waveform stored in the recorder 76 to be moved on bus 80 to the computer where it can be correlated to the microscope location and to a location pattern displayed on the screen of computer 16.

In FIG. 7, three exemplary defects have each been identified by an x. The number of line sync pulses 52 since the beginning of each frame (n, n+1, etc.) is stored at successive memory locations 74 (FIG. 8) in array 14b.

Referring now to FIGS. 4-8, a frame sync pulse 56 is detected as each frame begins. It is used to increment the memory array 14b and to clear and enable the counter 14a over control lines 64 and 65. Line sync pulses 52 on control line 62 also increment the counter 14a. If a dropout occurs, a signal from the dropout detector 12 stops the counter 14a. At the end of the frame, the counter 14a will have the number of the horizontal scan line that contains the dropout. The memory location corresponds to the frame. If there was no dropout in the frame, the line sync count will be 525, the number of lines per frame. As the next frame sync pulse 56 is received, the numbers in the counter 14a for the previous frame are transferred to the next memory location within array 14b via bus 66, the memory is incremented and the process is repeated for the next frame. When the predetermined length of tape is completed, the dropout locations in the memory array are transferred to the computer 16. Since this information contains the frame and horizontal scan line of each dropout in this length of tape, the computer calculates the X-Y position of each dropout and sequentially sends this information to the controller 20 in order to position the microscope 22. This information is also displayed on the computer's cathode ray tube (CRT) to give a pattern of the dropouts on the tape.

In the operable embodiment, the predetermined length is twenty inches. As the examination of each length of tape is completed, the operator has the option of examining the next length, moving back or skipping forward to a new tape length. In all of these tape movements, the linear position of the tape is maintained by counting the frame sync pulses and through computer control of the VCR 10 via a control line 82.

The equipment is configured to locate one dropout per frame and this set-up is satisfactory for most needs since the frequency of dropouts is low enough that it would be a rare occurrence to have more than one dropout per frame.

The counter 14a has been modified so that it can distinguish and exclusively account for defects of certain time intervals, specifically 5 $\mu$s, 10 $\mu$s and 15 $\mu$s defects.

Computer 16 is programmed to calculate the cartesian X-Y coordinates using the formulae $$X=(NF)(FL)-(NL)(LL) \cos \alpha,$$

and $$Y=EW+NL \ (LL) \sin \alpha, \text{ if } NL<262.5$$

and the formulae $$X=(NF+0.5) \ FL-(NL-262.5)(LL) \cos \alpha,$$

and $$Y=EW+(NL-262.5) \sin \alpha, \text{ if } NL>262.5,$$

where
  X is the distance in inches from first frame sync pulse on the tape to the frame sync pulse beyond a dropout,
  Y is the distance in inches from the audio edge to a dropout,
  NF is the number of frame pulses from the beginning of the tape,
  FL is the frame length in inches, i.e., the distance between frame sync pulses,
  NL is the number of line sync pulses since the beginning of the frame, i.e., the number stored in the memory location (1<NL<525),
  LL is the line length in inches, i.e., the distance between line sync pulses,
  EW is the edge width of audio information, and
  $\alpha$ is the track angle.

The track angle $\alpha$ and the distances X, Y, FL, EW have been identified in FIG. 7. Distance LL has been identified in FIG. 5.

The acutal distance ($X_L$) the microscope must be moved to be over a dropout is determined according to the formula $$X_L=X-X_R,$$

where
  $X_R$ is the distance from the first frame sync pulse on the tape to the frame sync pulse beyond which a dropuot is located.

The distances X and $X_R$ have been identified in FIG. 7.

Upon inspection of the above formulae for X, it will be apparent that it extends to a point slightly beyond the actual location of a dropout. This distance is but a small fraction of the diameter of the field of the microscope and is reduced by calibration of the distance $X_R$ by approximately one half the distance FL.

In tests of the operable embodiment, as many as forty dropouts have been located and examined in about fifteen minutes. Previously, only a few dropouts could be located in an hour. This capability of analyzing multiple defects in short periods of time has yielded valuable information as to the causes of defects, whether in the coating, the base film or the recording. Interestingly, dropouts are not always found at the locations of visible scratches or the like and there is no apparent visible evidence at the locations of other dropouts. Findings such as these cannot help but lead to video tapes of higher quality.

Figure 9:
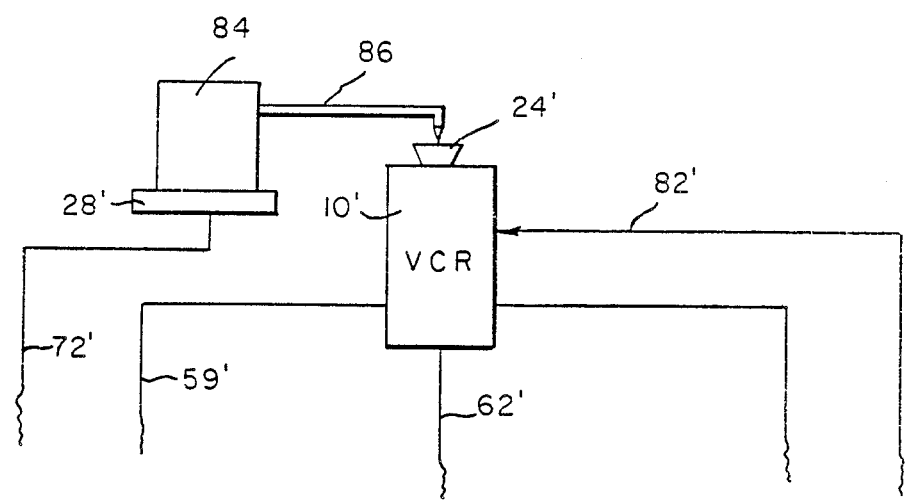
FIG. 9 is a fragmentary diagram showing the use of another embodiment of the tape-inspecting instrument.

Another embodiment of the tape-inspecting instrument appears in FIG. 9 where a profilometer 84 (Talysurf 5, Rank Taylor Hobson, Leicester, England) is mounted on positioning table 28'. Profilometer 84 has a stylus 86 which contacts a tape on shoe assembly 24'. This instrument is positioned over dropouts in the same manner as microscope 22 (FIG. 6). Topography of the tape is measured by traversing the stylus 86 over a selected area at the location of the dropout. This yields information as to high and low points and, therefore, as to the quality of the surface coating at the location of a dropout.

What is claimed as new and desired to be secured by Letters Patent is:

1. In an apparatus including a dropout detector connected to a helically scanned magnetic tape player, the improvement comprising provision of
    a positionable tape-inspecting instrument located adjacent the player,
    guide and transport elements for diverting tape from its normal path of advance into and through a path where it can be inspected by said instrument,
    a device for positioning the instrument, and
    means interfaced with the detector, player and device for computing data, based on information recorded on the tape, as to the locations of dropouts, controlling tape advance and, with said data, positioning the instrument at the location of any detected dropout.

2. The apparatus of claim 1 wherein said tape-inspecting instrument is a microscope.

3. The apparatus of claim 1 wherein said tape-inspecting instrument is a profilometer having a stylus adapted to contact the tape and be traversed over the tape at the location of each dropout.

4. In an apparatus including a helically scanned magnetic tape player and a dropout detector connected to the player, the improvement comprising provision of
    means interfaced with the player and detector for computing data as to the location of successive dropouts in a length of tape,
    a positionable microscope located adjacent the player,
    a shoe assembly associated with the player, said assembly having a surface over which a loop of the tape is advanced through the focal plane of the microscope, and
    a device for positioning the microscope, on the basis of said stored data, at the locations of successive dropouts.

5. A method comprising the steps of detecting dropouts in a predetermined length of a helically scanned magnetic tape,
    storing information as to successive dropouts in a memory array,
    computing data, based on said information, as to the locations of said dropouts,
    advancing said length of tape through a path adjacent a positionable tape-inspecting instrument and stopping it when the first dropout is located for inspection, and
    controlling the advance of the tape and the position of the instrument on the basis of said data, thereby locating successive dropouts for inspection.

6. The method of claim 5 wherein the tape recording is in the VHS format and said information is obtained by counting frame and line sync pulses.

7. The method of claim 6 wherein said tape-inspecting instrument is a microscope and said tape is advanced in the focal plane of the microscope.

8. The method of claim 6 wherein said tape-inspecting instrument is a profilometer having a stylus adapted to contact the tape and be traversed over the tape at the location of each dropout.

9. An apparatus including a helically scanned tape player having a magnetic tape with information recorded thereon,
    a dropout detector connected to the player for detecting momentary losses of signal from the recorded tape,
    a memory array connected to the dropout detector for storing information as to successive dropouts,
    a computer connected to the memory array for converting the information as to dropouts into data representative of the X-Y coordinate of the location of the dropout,
    a controller connected to the computer for receiving this data,
    a positionable tape-inspecting instrument located adjacent the player,
    guide and transport elements for diverting the tape from its normal path of advance into and through a path where it can be inspected by said instrument,
    a device for positioning the instrument, and
    means interfaced with the detector, player and device for controlling tape advance and, based on the computed data as to dropout locations, positioning the instrument at the location of any detected dropout.

* * * * *